(12) United States Patent
Take

(10) Patent No.: US 7,259,320 B2
(45) Date of Patent: Aug. 21, 2007

(54) THERMOELECTRIC CONVERSION MATERIALS

(75) Inventor: Seiji Take, Tokyo-to (JP)

(73) Assignee: Dai Nippon Printing Co., Ltd., Kyoungki-do (KR)

( * ) Notice: Subject to any disclaimer, the term of this patent is extended or adjusted under 35 U.S.C. 154(b) by 0 days.

(21) Appl. No.: 11/086,053

(22) Filed: Mar. 22, 2005

(65) Prior Publication Data

US 2005/0268956 A1 Dec. 8, 2005

(30) Foreign Application Priority Data

Mar. 31, 2004 (JP) ............... 2004-106425

(51) Int. Cl.
*H01L 35/12* (2006.01)
(52) U.S. Cl. .............. 136/236.1; 428/402; 428/403
(58) Field of Classification Search ........... 136/236.1, 136/205, 211, 212, 237, 250, 251; 257/467; 428/402, 403
See application file for complete search history.

(56) References Cited

U.S. PATENT DOCUMENTS 5,168,339 A * 12/1992 Yokotani et al. ............ 257/64
2003/0099279 A1 * 5/2003 Venkatasubramanian et al. 374/179

FOREIGN PATENT DOCUMENTS

JP 7-283442 A * 10/1995

OTHER PUBLICATIONS

Printouts from WebElements Periodic Table: Professional Edition, Bismuth (III) Telluride and Antimony (III) Telluride, year not available.*
Katsuyama, S., et al., (2000) "Thermoelectric properties of $CoSb_3$ with dispersed $FeSb_2$ particles." Journal of Applied Physics. vol. 88, No. 6, pp. 3484-3489.
Cook, B.A., et al. (1996) "Fullerite additions as a phonon scattering mechanism in p-type Si-20 at.% Ge." Materials Science and Engineering B41. pp. 280-288.
Harman, T.C., et al. (2000) "PbTe-Based Quantum-Dot Thermoelectric Materials with High ZT." IEEE. 18th International Conference on Thermoelectrics 1999. pp. 280-284.
Hicks, L.D., et al. (1993) "Thermoelectric figure of merit of a one-dimensional conductor." The American Physical Society. vol. 47, No. 24. pp. 16-631-16-634.
Toprak, M., et al. (2000) "Nano-engineered Thermoelectric Coating." NATO Sci Ser 78 (Nanostructured Films and Coatings). pp. 149-156.

* cited by examiner

*Primary Examiner*—Nam Nguyen
*Assistant Examiner*—Anthony Fick
(74) *Attorney, Agent, or Firm*—Ladas & Parry LLP

(57) ABSTRACT

The main object of the present invention is to provide thermoelectric conversion materials having a high thermoelectric conversion performance and excellent mass productivity. The thermoelectric conversion materials have a core-shell structure with a plurality of core parts and shell parts for covering the core parts. The plurality of core parts are independent of each other and the shell parts are provided continuously such that the shell part of one core part is continuous with the shell part of a different core part.

4 Claims, 2 Drawing Sheets

THERMOELECTRIC CONVERSION MATERIALS

BACKGROUND OF THE INVENTION

1. Field of the Invention

The present invention relates to thermoelectric conversion materials used for a thermoelectric conversion element, or the like.

2. Description of the Related Art

High conversion efficiency from the thermal energy to the electric energy is required to the thermoelectric conversion materials used for a thermoelectric conversion element. That is, the following performances are required. (1) A voltage generated at the time of providing a temperature difference is preferably large so that a high thermoelectric power per the temperature difference 1K is required. (2) In the case the electric resistance is large, since the energy is lost by the Joule's heat at the time an electric current is supplied, a smaller electric resistance is preferable. (3) Since the thermal energy to be converted to the electric energy is escaped as the heat due to the thermal conduction, a smaller thermal conductivity is preferable. From these facts, the characteristics of the thermoelectric conversion materials can be dominated by the value represented by the below formula (i) referred to as a performance index Z.

$$Z = S^2 \cdot \sigma / k \qquad (i)$$

Here, S is the thermoelectric power, $\sigma$ is the conductivity, and k is the thermal conductivity. A material having a larger performance index Z can provide more excellent thermoelectric conversion materials.

Recently, as an attempt for improving the performance of the thermoelectric conversion materials, dispersion of fine particles in the thermoelectric conversion materials has been studied. In the case a material having a high mobility such as a skutterudite compound and a SiGe is used as the thermoelectric conversion materials, the high conductivity $\sigma$ of these materials contributes to the performance improvement. On the other hand, due to the high thermal conductivity k thereof, the performance index Z has not been made larger. However, by dispersing the fine particles in such thermoelectric conversion materials, since the phonons are scattered by the fine particles, the thermal conductivity k can be made smaller so as to improve the performance.

For example, the thermoelectric conversion materials having $FeSb_2$ fine particles introduced in the matrix of a skutterudite compound to 40% by the mole ratio by the mechanical alloying process are proposed in J. Applied Physics, 88, p. 3484-3489 (2000). It is disclosed that the size of the $FeSb_2$ fine particles is of the submicron order, and the performance index in a range of 600K to 800K of the substance with the $FeSb_2$ fine particles introduced is larger than the substance without the introduction of the $FeSb_2$ fine particles. However, the performance improvement of the introduction of the $FeSb_2$ fine particles is not shown at 500K or lower.

Moreover, according to Materials Science and Engineering, B41, p. 280-288 (1996), a 0.7 nm particle size fullerite (a mixture of C60: 90% and C70: 10%) is introduced into a SiGe alloy (Ge: 20 atm %) to 1 wt % by the mechanical alloying process. However, the fullerite dispersing property is not disclosed and the performance improvement is not mentioned. The main cause why the performance is not improved is considered to be the reduction of the conductivity $\sigma$ accompanied by the reduction of the thermal conductivity k by the introduction of the fine particles.

Furthermore, the 18th International Conference on Thermoelectrics, p. 280-284 (1999) proposes a method for improving the performance by a PbTe/PbSeTe based quantum dot super lattice. The quantum dot super lattice is produced by alternately laminating a PbTe and a PbSeTe (composition mole ratio Pb:Se:Te=1.00:0.98:0.02, hereinafter it is omitted) by the molecular beam epitaxy method, utilizing the granular change of a film of the PbSeTe formed on the PbTe from a thin film immediately after the film formation by the lattice unconformity with the PbTe according to the time passage. By further forming a film of the PbTe so as to cover the PbSeTe particles having had the granular change on the PbTe film and again forming a film of the PbSeTe, a quantum dot super lattice with the PbSeTe fine particles (quantum dots) regularly dispersed in the PbTe can be obtained. The size of the PbSeTe fine particles was 30 nm or less. In a range of 300K to 500K, the system with the PbSeTe fine particle introduction in the PbTe showed the performance index larger than the system without the introduction by as much as 7 times to 13 times. This is considered that not only the above-mentioned phonon scattering effect but also the quantum effect contribute to the performance improvement. This theory is described in detail in Phys. Rev. B, 47, p. 16631 (1993). In general, the size having the quantum effect appearance is 100 nm or less.

However, since the quantum dot super lattice is produced by alternately laminating the PbTe and the PbSeTe in a vacuum system by the molecular beam epitaxy method as mentioned above, a problem is involved in that much labor is required. Moreover, the thickness of each layer is about 10 nm. However, in the case it is used as the thermoelectric conversion materials, a 10 nm or more thickness is needed, and thus at least 500 each layers need to be laminated, and thus it is not suitable for the mass production.

On the other hand, although it is not a system with the fine particles dispersed in a thermoelectric conversion material, Nanostructured Films and Coatings, p. 149-156 (2000) proposes a method of covering $SiO_2$ fine particles with a skutterudite compound. This is a method of coating a gold by sputtering on $SiO_2$ fine particles having a 300 nm particle size with 10 to 60 nm thickness, and furthermore, coating a $CoSb_3$ as one kind of the skutterudite compounds thereon. The $CoSb_3$ is formed by reduction firing after coating a precursor thereof on the gold. However, according to this method, the $SiO_2$ fine particles are used merely as a supporting substance without describing the phonon scattering effect by the $SiO_2$ fine particles. Moreover, since a reducing gas is used at the time of reducing the precursor of the $CoSb_3$, a problem is involved in that the precursor may not be reduced sufficiently to the inside.

SUMMARY OF THE INVENTION

The main object of the present invention is to provide the thermoelectric conversion materials having a high thermoelectric conversion performance and the excellent mass productivity.

In order to achieve the above-mentioned object, the present invention provides the thermoelectric conversion materials comprising a core-shell structure having a plurality of core parts and shell parts for covering the above-mentioned core parts, wherein the plurality of the above-mentioned core parts are independent with each other and the above-mentioned shell parts are provided continuously.

In the present invention, since the plurality of the core parts are provided independent with each other in a state dispersed finely in the core-shell structure, at the time of conduction of the electricity and the heat in the core-shell structure, the phonons are scattered by the core parts, and thus the thermal conductivity can be made smaller so as to improve the thermoelectric conversion performance. Moreover, since the core-shell structure in the present invention can be produced by the compression molding of the core-shell fine particles having a core-shell structure, compared with the production of the quantum dot super lattice mentioned above, it is suitable for the mass production, and thus it is advantageous.

In the above-mentioned invention, it is preferable that a constituent material of the above-mentioned core parts has a melting point higher than that of a constituent material of the above-mentioned shell parts. As mentioned above, since the core-shell structure in the present invention is produced by the compression molding of the core-shell fine particles having a core-shell structure so that the constituent material of the shell parts is melted at the time of the compression molding so as to form a core-shell structure by coupling of the shell parts of the adjacent core-shell fine particles with each other, it is preferable that the constituent material of the shell parts is melted and the constituent material of the core parts is not melted at the time of the compression molding.

According to the present invention, since the phonons are scattered by the core parts present independently in a dispersed state at the time of the conduction of the electricity and the heat in the core-shell structure, the thermal conductivity can be made smaller so that the thermoelectric conversion performance can be improved. Moreover, since the core-shell structure in the present invention can be produced by the compression molding of the core-shell fine particles having a core-shell structure, the effect of the suitability of the mass production can be provided.

DESCRIPTION OF THE PREFERRED EMBODIMENT

Hereinafter, thermoelectric conversion materials of the present invention will be explained in detail.

The thermoelectric conversion materials of the present invention are characteristic in comprising a core-shell structure having a plurality of core parts and shell parts for covering the above-mentioned core parts, wherein the plurality of the above-mentioned core parts are independent with each other and the above-mentioned shell parts are provided continuously.

Figure 1:
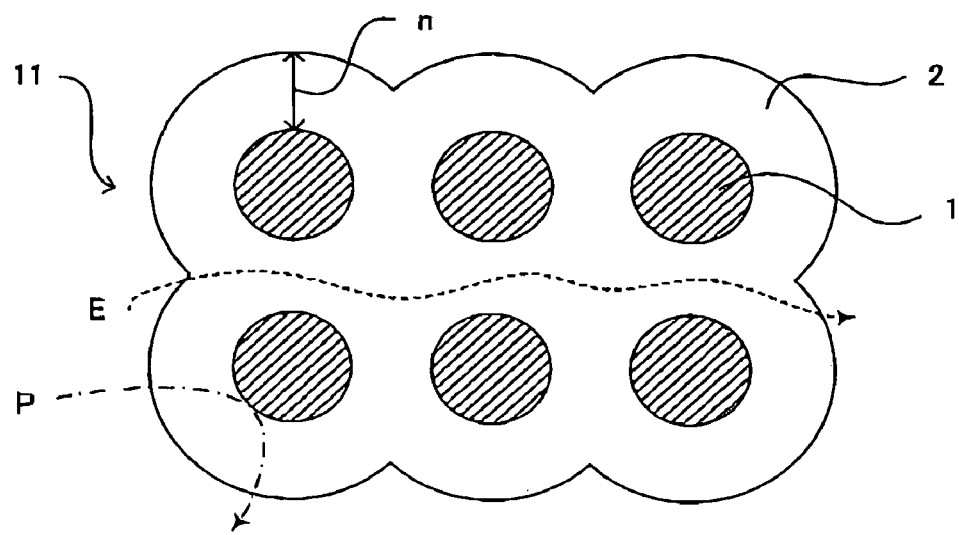
FIG. 1 is a schematic cross-sectional view showing an example of the core-shell structure used in the present invention.

The thermoelectric conversion materials of the present invention will be explained with reference to the drawings. FIG. 1 is a schematic cross-sectional view showing an example of the core-shell structure comprising the thermoelectric conversion materials of the present invention. In FIG. 1, a core-shell structure 11 comprises a plurality of core parts 1, and shell parts 2 covering the core parts 1. Moreover, a plurality of the core parts 1 independent with each other are present in the core-shell structure 11 in a dispersed state. On the other hand, the shell parts 2 are not independent with each other but provided continuously.

Figure 2A:
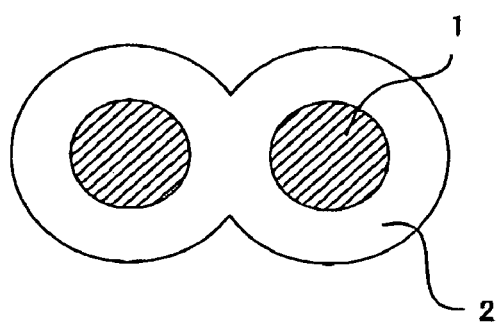
FIGS. 2A and 2B are diagrams for explaining the shell parts.
Figure 2B:
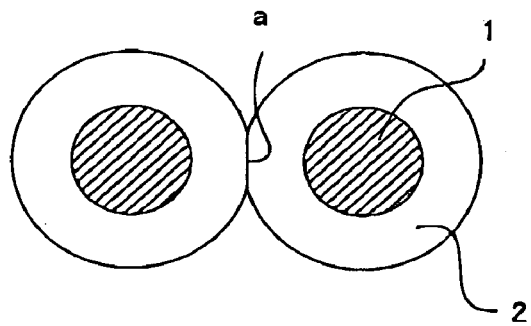

In the present invention, "the shell parts are provided continuously" includes not only the case without the presence of the interface in the inside of the shell parts for example as shown in FIG. 2A, but also the case with an interface present in the inside to some extent because the conductivity of the electrons moving in the shell parts is improved, and furthermore, even when there is a portion provided partially discontinuous or independent is also included in the concept of "continuously" in the present invention. Here, "the interface is present" denotes the state with the shell parts 2 covering the adjacent core part 1 not coupled with each other and having the interface a present therebetween for example as shown in FIG. 2B.

According to the present invention, since the core parts 1 are present in the core-shell structure 11 in a state dispersed finely, at the time of the conduction of the electricity and the heat in the core-shell structure 11, the phonons are scattered by the core parts 1 so as to be moved in an arrow P direction, the heat conduction is disturbed so that the thermal conductivity can be made smaller. On the other hand, since the shell parts 2 are provided continuously, the electrons can barely be scattered so that they can move in the shell parts 2 as shown by the arrow E, and thus the conductivity cannot be reduced drastically. Moreover, in the case the thickness of the shell parts 2 as the passage of the electrons and the phonons is 100 nm or less, which can have appearance of the quantum effect, the performance index Z may be improved by the quantum effect. Therefore, according to the present invention, the thermoelectric conversion performance can be improved.

Moreover, since the core-shell structure in the present invention, as described later, can be produced by the compression molding of the core-shell fine particles having a core-shell structure, compared with the production of the quantum dot super lattice, it is suitable for the mass production, and thus it is advantageous.

The thermoelectric conversion materials of the present invention are not particularly limited as long as they comprise a core-shell structure. Hereinafter, such a core-shell structure will be explained.

1. Core-Shell Structure

The core-shell structure used in the present invention comprises a plurality of core parts and shell parts for covering the core parts. Moreover, the plurality of the core parts are independent with each other and the shell parts are provided continuously.

Hereinafter, each configuration of the core-shell structure will be explained.

(1) Shell Parts

The shell parts in the present invention are for covering the core parts to be described later. Moreover, the shell parts in the present invention are provided continuously in the core-shell structure, and as mentioned above, it is preferable that little interface is present in the inside of the shell parts, and it is particularly preferable that no interface is present in the inside.

The constituent material for the shell parts used in the present invention is not particularly limited as long as it is a material having a conductivity, capable of generating the thermoelectric power, and capable of covering the core parts using the hot soap method. Since the hot soap method will be described in detail in the column of "2. Method for producing the thermoelectric conversion materials" to be described later, explanation is omitted here.

The conductivity of the constituent material of the above-mentioned shell parts has the conductivity of preferably 100 s/m or more, more preferably 1,000 s/m or more, and particularly preferably 10,000 S/m or more. If the above-mentioned conductivity is too small, the thermoelectric conversion performance may be deteriorated. On the other hand, although the upper limit value of the above-mentioned conductivity is not particularly limited, it is in general 1E+9 S/m or less.

Moreover, the conductivity of the constituent material for the above-mentioned shell parts has the mobility at 300K of preferably 0.001 $m^2$/Vs or more, more preferably 0.005 $M^2$/Vs or more, and particularly preferably 0.01 $m^2$/Vs or more. If the above-mentioned mobility is too small, the thermoelectric conversion performance may be deteriorated. On the other hand, although the upper limit value of the above-mentioned mobility is not particularly limited, it is in general 100 $m^2$/Vs or less.

Furthermore, the constituent material for the above-mentioned shell parts has the thermoelectric power of preferably 10 μV/K or more, more preferably 30 μV/K or more, and particularly preferably 100 μV/K or more. If the above-mentioned thermoelectric power is too small, the thermoelectric conversion performance may be deteriorated. On the other hand, although the upper limit value of the above-mentioned thermoelectric power is not particularly limited, it is in general 5,000 μV/K or less.

It is preferable that the constituent material for the above-mentioned shell parts has a melting point lower than that of the constituent material for the core parts to be described later. In the case the size of the fine particles is 1 μm or less, the melting point of the fine particles may be lower than the melting point inherent to the material. The melting point in the present invention denotes the melting point inherent to the material.

The core-shell structure in the present invention is produced by the compression molding of core-shell fine particles having the core-shell structure as it will be described later. At the time of the compression molding, the constituent material of the shell parts is melted so that the shell parts of the adjacent core-shell fine particles are coupled with each other so as to form the core-shell structure. Therefore, it is preferable that the constituent material for the shell parts is melted and the constituent material for the core parts is not melted. The melting point of the constituent material for the above-mentioned shell parts is not particularly limited as long as it is lower than the melting point of the constituent material for the core parts. Specifically, it is preferably 5,000° C. or less, more preferably in a range of 500° C. to 3,000° C., and particularly preferably in a range of 700° C. to 2,500° C.

Such a constituent material for the shell parts may comprise either a single component, two components, or multiple components of three or more. In particular, it comprises preferably a single component or two components because it may be difficult to produce the shell parts comprising multiple components.

As the constituent material for the shell parts used in the present invention, specifically, a skutterudite compound represented by $MX_3$ (M: Co, Rh, Ir, X: P, As, Sb), a SiGe alloy (Ge content: 20 to 80 atm %), a metal or a semiconductor comprising a single element such as Si, Ge, Co, Sb, Te and Bi, a compound as a combination of a 4B group element and a 6B group element such as PbTe and SnTe, a compound a's a combination of a 3B group element and a 5B group element such as InAs, InSb, InBi, GaAs, and GaSb, a compound as a combination of a 4B group element and a 6B group element such as ZnSe, ZnTe, CdSe and CdTe, a rare earth chalcogen compound represented by $La_3Te_4$, a compound of an element selected from the transition elements and Mg, and Si such as $Mg_2Si$, CoSi, $CrSi_2$, $MnSi_{(2-x)}$, and $FeSi_2$, a layered oxide represented by $NaCO_2O_4$, ZnAlO, or the like can be presented. In the present invention, among the above-mentioned examples, a skutterudite compound, a SiGe alloy, a compound as a combination of a 4B group element and a 6B group element, a compound as a combination of a 3B group element and a 5B group element, and a compound as a combination of a 4B group element and a 6B group element can be used particularly preferably owing to the high mobility.

These constituent materials for the shell parts may be doped as needed for the purpose of improving the conductivity. For example, by doping P or Ga to InAs, a compound such as $InAs_{0.9}P_{0.1}$ and $In_{0.9}Ga_{0.1}As$ can be provided. As to the doping method, a method commonly executed in the field of the semiconductor after the formation of the core-shell structure can be adopted. For example, the thermal diffusion can be adopted. Alternatively the doping operation may be carried out by adding a doping element or a precursor including a doping element to the starting material at the time of producing the core-shell structure by the method to be described later.

In the present invention, the thickness of the portion covering the core parts of the shell parts is not particularly limited as long as the electrons and the phonons can be conducted and the quantum effect can be realized. Specifically, it is preferably in a range of 1 nm to 100 nm, more preferably in a range of 1 nm to 70 nm, and particularly preferably in a range of 2 nm to 50 nm. In the case the above-mentioned thickness is too thin, the electrons cannot be conductive sufficiently so that the performance may be deteriorated due to the reduction of the conductivity. On the other hand, in the case the above-mentioned thickness is too thick, the phonon scattering effect by the core parts can hardly be obtained. Here, the thickness of the portion covering the core parts of the above-mentioned shell parts is for example the thickness shown by n in FIG. 1.

The thickness of the portion covering the core parts of the above-mentioned shell parts can be obtained by subtracting the particle size of the fine particles with only the core parts formed from the particle size of the fine particles with the shell parts formed and dividing the value by two. The particle size of each fine particles is the value obtained by selecting an area confirmed to have the presence of 20 or more fine particles among the images obtained using a scanning electron microscope (SEM) or a transmission electron microscope (TEM) for the thermoelectric conversion materials of the present invention, measuring the particle sizes of all the fine particles in the area, and calculating the average value. However, the part not focused appropriately and blurred is excluded from the measurement subject.

(2) Core Parts

Next, the core parts in the present invention will be explained. The core parts in the present invention are covered with the above-mentioned shell parts, provided independently with each other in the core-shell structure.

The core parts in the present invention may be those independent with each other in the core-shell structure, and it is preferable that they are dispersed evenly. Since the core parts are dispersed evenly in the core-shell structure, the phonons can be scattered efficiently so that the thermal conductivity can be reduced effectively.

The constituent material for the core parts used in the present invention is not particularly limited as long as they are fine particles capable of forming the interface with respect to the constituent material for the above-mentioned shell parts and capable of maintaining the core-shell structure at the time of the compression molding for forming the core-shell structure.

Moreover, it is preferable that the core part fine particles comprising the above-mentioned core parts have a melting point higher than that of the constituent material for the above-mentioned shell parts. Since the core-shell structure in the present invention is formed by the compression molding of the core-shell fine particles having the core-shell structure, it is preferable that the constituent material of the shell parts is melted at the time of the compression molding and the constituent material for the core parts is not melted. The melting point of the above-mentioned core part fine particles is not particularly limited as long as it is a temperature higher than the melting point of the constituent material for the shell parts Specifically, it is preferably higher than the melting point of the constituent material for the shell parts mentioned above by 50° C. or more. In the case the difference of the melting points of the core part fine particles and the constituent material for the shell parts is too small, the core part fine particles may be melted at the time of the compression molding.

The specific melting point of the constituent material for the core parts is in a range of 550° C. to 5,000° C., in particular it is preferably in a range of 1,050° C. to 4,000° C.

As such core part fine particles, for example, inorganic oxides such as $SiO_2$, $Al_2O_3$, and ZnO, inorganic nitrides such as BN, and $Si_3N_4$, materials comprising a single element such as Au, Cu, U, Mn, Sm. Be, Gd, Tb, Si, Ni, Co, Dy, Y, Er, Fe, Sc, Pd, Ti, Th, Pt, Zr, Cr, V, Rh, Hf, B, Ru, Ir, Nb, Mo, Os, Ta, Re and W, an alloy including at least one of the above-mentioned elements, inorganic silicides such as NiSi, FeSi and TiSi, inorganic carbonates such as SiC and MoC, a carbon, $CB_4$, or the like can be presented.

Figure 3A:
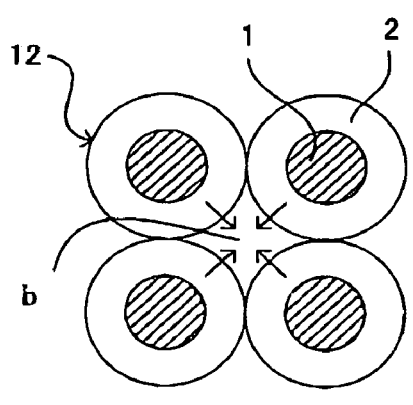
FIGS. 3A and 3B are diagrams for explaining the core parts and the shell parts.
Figure 3B:
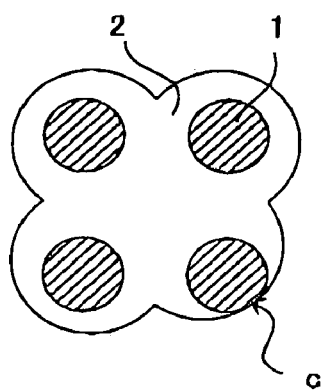

The average particle size of the above-mentioned core part fine particles is not particularly limited as long as it is a size capable of effectively scattering the phonons. Specifically, it is preferably in a range of 0.3 nm to 100 nm, more preferably in a range of 1 nm to 70 nm, and particularly preferably in a range of 2 nm to 50 nm. In the case the above-mentioned average particle size is too large, at the time of forming the core-shell structure, even if the core-shell fine particles 12 are arranged without a gap as shown, for example, in FIG. 3A, the space b generated between the core-shell fine particles 12 becomes large so that the constituent material for the shell parts 2 flows into the space b at the time of the compression molding so as to generate a portion c without having the core parts 1 covered with the shell parts 2 for example as shown in FIG. 3B, failing to maintain the core-shell structure, and thus a portion having an extremely thin shell thickness or a portion with an extremely thick shell thickness may be generated. Moreover, fine particles having an average particle size smaller than the above-mentioned range can hardly be produced.

The above-mentioned average particle size is the value obtained by selecting an area confirmed to have the presence of 20 or more core parts among the images obtained using a scanning electron microscope (SEM) or a transmission electron microscope (TEM) for the thermoelectric conversion materials of the present invention, measuring the particle sizes of all the core parts in the area, and calculating the average value. However, the core parts not focused appropriately and blurred are excluded from the measurement subject.

Moreover, it is preferable that the standard deviation of the average particle size of the core part fine particles is 20% or less, more preferably it is 10% or less. In the case the above-mentioned standard deviation is too large, a large space may be generated between the core-shell fine particles as mentioned above in the stage before the compression molding of the core-shell fine particles.

(3) Others

The ratio of the particle size of the core parts and the thickness of the shell parts in the core-shell structure used in the present invention is not particularly limited as long as the electrons and the heat can be conducted and the phonons can be scattered by the core parts. Specifically, it is preferably in a range of 1:10 to 10:1, more preferably in a range of 1:7 to 7:1, and particularly preferably in a range of 1:5 to 5:1. Since the ratio of the core parts and the shell parts is in the above-mentioned range, the thermal conductivity can be reduced effectively.

2. Method for Production the Thermoelectric Conversion Materials

Next, the method for producing the thermoelectric conversion materials of the present invention will be explained. In the present invention, as a method for forming the shell parts at the time of covering the core parts with the shell parts, it is preferable to use a liquid phase method. The liquid phase method is advantageous, since a chemically homogeneous composition can be provided in the case of two or more kinds of the constituent elements. As this liquid phase method, the coprecipitation method, the reverse micelle method, and the hot soap method can be cited. Among them, it is preferable to use the hot soap method in the present invention.

Here, the hot soap method is a method of promoting the crystal core formation and the crystal growth by the reaction commenced as a result of the thermal decomposition of at least one kind of a precursor of a compound to be targeted in a dispersing agent heated to a high temperature. For the purpose of controlling the reaction rate of the processes of the core formation and the crystal growth of the crystal, a dispersing agent having an appropriate coordination force to the constituent elements of a targeted compound is used as the essential component for providing a liquid phase medium. Since the state of stabilizing the crystal by coordination by the dispersing agent is similar to the state of stabilizing oil droplet in water by the soap molecules, this reaction is referred to as the hot soap method.

In the present invention, since the shell parts can be grown around the core parts with the core parts provided as the core by using such hot soap method, it is advantageous in that the core parts can be covered evenly with the shell parts.

Hereinafter, the method for producing the thermoelectric conversion materials using the hot soap method will be explained.

In the present invention, the method for producing the thermoelectric conversion materials using the hot soap method comprises a core part preparing process for preparing the core part fine particles, a shell part preparing process for forming core-shell fine particles having the core-shell structure by heating a dispersing agent and injecting the above-mentioned core part fine particles and a shell part precursor including the constituent elements of the shell parts into the heated dispersing agent for covering the core parts with the shell parts, a removing process for removing the residual organic substance, and a compression molding process for compression molding the core-shell fine particles after removal of the organic substance. Hereinafter, each process of the method for producing the thermoelectric conversion materials will be explained.

(1) Core Part Preparing Process

The core part preparing process in the present invention is a process for preparing the core part fine particles.

The method for forming the core part fine particles used in the present invention is not particularly limited as long as it is a method capable of forming the core part fine particles as disclosed in the column of the core parts of the above-mentioned "1. Core-shell structure". As in the case of the method for forming the shell parts, it is preferable to use the liquid phase method, and it is particularly preferable to use the hot soap method. By using the hot soap method, core part fine particles having a narrow particle size distribution can be obtained. Moreover, the core part fine particles obtained using the hot soap method have a good dispersing property in the shell part precursor including the shell part constituent elements and the dispersing agent in the shell part preparing process to be described later.

In order to form the core part fine particles using such hot soap method, a method of heating a dispersing agent and injecting a core part precursor including the constituent elements of the core parts to the heated dispersing agent can be used.

Hereinafter, the method for forming the core part fine particles using the hot soap method will be explained.

The core part precursor used in the present invention is not particularly limited as long as it includes the constituent elements of the core parts mentioned above and it is capable of forming the above-mentioned core part fine particles. For example, to form the ZnO fine particles, as the core part precursor, a compound including Zn and a compound including O may be used. Specifically, those disclosed in J. Am. Chem. Soc., 123, p. 11651-11654 (2001) can be used. For example, $Zn(C_2H_5)_2$ and $O_2$ can be used. Moreover, in the case two or more kinds of the core part precursors are used, the mixing ratio may be set for example according to the stoichiometric ratio of the targeted compound.

Moreover, it is preferable that the above-mentioned core part precursor is liquid in terms of the convenience in the production operation. If the core part precursor itself is liquid at a room temperature, it may be used as it is, or as needed, it may be dissolved or a dispersed in an appropriate organic solvent. As such an organic solvent, alkanes such as a n-hexane, a n-heptane, a n-octane, an isooctane, a nonane and a decane, aromatic hydrocarbons such as a benzene, a toluene, a xylene, and a naphthalene, ethers such as a diphenyl, ether, a di (n-octyl) ether, halogen based hydrocarbons such as a chloroform, a dichloromethane, a dichloroethane, a monochlorobenzene and a dichlorobenzene, amines such as a n-hexylamine, a n-octylamine, a tri(n-hexyl) amine, and a tri(n-octyl) amine, or a compound to be used for the dispersing agent to be described later, or the like can be presented. Among these examples, the alkanes such as a n-hexane, a n-heptane, a n-octane, and an isooctane, the trialkyl phosphines such as a tributyl phosphine, a trihexyl phosphine, and a trioctyl phosphine, and the ethers can be used preferably.

Furthermore, in the case at least one kind of the above-mentioned core part precursors is a gas, it may be introduced into the above-mentioned organic solvent or a dispersing agent by dissolving with bubbling, or the like, or the gas can be introduced directly to the reaction liquid phase after the injection of the other core part precursors.

The dispersing agent used in the present invention is not particularly limited as long as it is a substance to be stabilized by the coordination to microcrystals in a high temperature liquid phase. For example, trialkyl phosphines such as a tributyl phosphine, a trihexyl phosphine, and a trioctyl phosphine, organic phosphorous compounds such as a tributyl phosphine oxide, a trihexyl phosphine oxide, a trioctyl phosphine oxide and a tridecyl phosphine oxide, ω-amino alkanes such as an octyl amine, a decyl amine, a dodecyl amine, a tetradecyl amine, a hexadecyl amine and an octadecyl amine, tertiary amines such as a tri (n-hexyl) amine, and a tri (n-octyl) amine, organic nitrogen compounds such as an aromatic compound including a nitrogen like a pyridine, a lutidine, a collidine, and quinolines, dialkyl sulfides such as a dibutyle sulfide, dialkyl sulfoxides such as a dimethyl sulfoxide and a dibutyl sulfoxide, organic sulfur compounds such as an aromatic compound including a sulfur like a thiophene, higher fatty acids such as a palmitic acid, a stearic acid and an oleic acid, a 1-adamantanecarboxylic acid, and the like can be cited. Among these examples, the compounds including a nitrogen atom or a phosphorus atom in the molecule structure, such as the trialkyl phosphines such as a tributyl phosphine, and a trioctyl phosphine, the trialkyl phosphine oxides such as a tributyl phosphine oxide and a trioctyl phosphine oxide, the Ω-amino alkanes having 12 or more carbon atoms such as a dodecyl amine, a hexadecyl amine, and an octadecyl amine, or the like can be used preferably. As the further preferable ones, the compounds having a carbon-phosphorus single bond such as the trialkyl phosphines such as a tributyl phosphine, and a trioctyl phosphine, the trialkyl phosphine oxides such as a tributyl phosphine oxide and a trioctyl phosphine oxide, or the like can be presented. In particular, the trialkyl phosphine oxides such as a trioctyl phosphine oxide can be used preferably. These dispersing agents may be used alone or as needed as a mixture of a plurality of the kinds.

Furthermore, the above-mentioned dispersing agents may be diluted and used by an appropriate organic solvent (for example, aromatic hydrocarbons such as a toluene, a xylene, and a naphthalene, long chain alkanes such as an octane, a decane, a dodecane, and an octadecane, ethers such as a diphenyl ether, a di(n-octyl) ether, and a tetrahydrofuran, halogen based hydrocarbons, or the like).

The heating temperature for the dispersing agent is not particularly limited as long as it is a temperature capable of melting the dispersing agent and the core part precursor. Although it may vary depending upon the pressure condition, or the like, it is in general 150° C. or higher. Moreover, it is preferable that the heating temperature is relatively high. By setting the same at a high temperature so as to decompose the core part precursor injected to the dispersing agent collectively, a large number of cores are produced at the same time, and thus core part fine particles having a relatively small particle size can easily be obtained.

Moreover, the method for injecting the core part precursor to the heated dispersing agent is not particularly limited as long as it is a method capable of forming core part fine particles. Moreover, it is preferable to carry out the core part precursor injection for one time further preferably within a short time in order to obtain core part fine particles having a relatively small particle size. In the case of having a large particle size, the injection may be executed by a plurality of times and it may be carried out continuously.

The reaction temperature at the time of forming the core part fine particles after injecting the core part precursor to the heated dispersing agent is not particularly limited as long as it is a temperature capable of melting the dispersing agent and core part precursor or dissolving the same in an organic solvent, and capable of generating the crystal growth. Although it may vary depending upon the pressure condition, or the like, it is in general 150° C. or higher.

After forming the core part fine particles by injecting the core part precursor to the dispersing agent as mentioned above, in general the core part fine particles are separated from the dispersing agent. As the separation method, for example, the sedimentation methods such as the centrifugal separation, the floatation and the foam separation, the filtration methods such as the cake filtration and the clarifying filtration, and the squeeze method can be presented. In the present invention, among the above-mentioned examples, the centrifugal separation can be used preferably. However, the core part fine particles obtained after the separating operation are obtained in many cases as a mixture with a small amount of a dispersing agent.

At the time of the separation, in the case the sedimentation of the core part fine particles is difficult due to too small a size of the core part fine particles, in order to improve the sedimentation property, additives like alcohols having 1 to 4 carbons such as an acetonitrile, a methanol, an ethanol, a n-propyl alcohol, an isopropyl alcohol, a n-butyl alcohol, an isobutyl alcohol, a secondary butyl alcohol and a tert butyl alcohol, aldehydes having 1 to 4 carbons such as a formaldehyde, an acetaldehyde, an acrolein, and a crotonaldehyde, ketones having 3 to 5 carbons such as an acetone, a methyl ethyl ketone, and a diethyl ketone, ethers having 2 to 4 carbons such as a dimethyl ether, a methyl ethyl ether, a diethyl ether, and a tetrahydrofuran, and organic nitrogen containing compounds having 1 to 4 carbons such as a methyl amine, a dimethyl amine, a trimethyl amine and a dimethyl formamide can be used. Among these examples, water, or alcohols such as a methanol and an ethanol can be used preferably. The above-mentioned additives may be used either alone or as a mixture of two or more kinds.

The above-mentioned core part fine particles are formed in general under an inert gas atmosphere such as an argon gas and a nitrogen gas.

(2) Shell Part Preparing Process

Next, the shell part preparing process in the present invention will be explained. The shell part preparing process in the present invention is a process for forming the core-shell fine particles having the core-shell structure by heating a dispersing agent, and injecting the above-mentioned core part fine particles and a shell part precursor including the shell part constituent elements to the heated dispersing agent so as to cover the core parts with the shell parts.

The shell part precursor used in the present invention is not particularly limited as long as it includes the constituent elements of the shell parts mentioned above and it is capable of covering the above-mentioned core part fine particles. For example, in the case the core part fine particles are covered with a $CoSb_3$, a compound including Co and a compound including Sb may be used as the shell part precursor. As a compound including Co, an organic metal compound including Co can be used. For example, a cobalt carbonyl, or the like can be presented. Moreover, as a compound including Sb, an organic metal compound including Sb can be used. For example, Sb alkoxide, or the like can be presented. Moreover, in the case two or more kinds are used as the shell part precursors accordingly, the mixing ratio may be set for example according to the stoichiometric ratio of the targeted compound.

Moreover, it is preferable that the above-mentioned shell part precursor is liquid in terms of the convenience in the production operation. If the shell part precursor itself is liquid at a room temperature, it may be used as it is, or as needed, it may be dissolved or a dispersed in an appropriate organic solvent. As such an organic solvent, alkanes such as a n-hexane, a n-heptane, a n-octane, an isooctane, a nonane and a decane, aromatic hydrocarbons such as a benzene, a toluene, a xylene, and a naphthalene, or a compound to be used for the dispersing agent mentioned above, or the like can be presented. Among these examples, the alkanes such as a n-hexane, a n-heptane, a n-octane, and an isooctane, the trialkyl phosphines such as a tributyl phosphine, a trihexyl phosphine, and a trioctyl phosphine, and the ethers can be used preferably.

Furthermore, in the case at least one kind of the above-mentioned shell part precursors is a gas, it may be introduced into the above-mentioned organic solvent or a dispersing agent by dissolving with bubbling, or the like, or the gas can be introduced directly to the reaction liquid phase after the injection of the other shell part precursors.

Since the dispersing agents are same as those disclosed in the item of the above-mentioned core part preparing process, explanation is omitted here.

The heating temperature for the dispersing agent is not particularly limited as long as it is a temperature capable of melting the dispersing agent and the shell part precursor or dissolving the same into an organic solvent. Although it may vary depending upon the pressure condition, or the like, it is in general 60° C. or higher.

Moreover, the method of injecting the above-mentioned core part fine particles and the shell part precursor to the heated dispersing agent is not particularly limited as long as it is a method capable of covering the core parts with the shell parts. For example, the core part fine particles and the shell part precursor may be injected at the same time, or the core part fine particles may be injected first. In the present invention, it is preferable to inject the shell part precursor gradually after the injection of the core part fine particles. In the case the shell part precursor is injected first or by a large amount at one time, the core formation may be generated by the shell part precursor so that the fine particles comprising only the shell parts may be formed.

The reaction temperature at the time of covering the core parts with the shell parts after the injection of the above-mentioned core part fine particles and the shell part precursor to the heated dispersing agent is not particularly limited as long as it is a temperature capable of melting the above-mentioned dispersing agent and shell part precursor or dissolving the same in the organic solvent, and generating the crystal growth of the shell part constituent materials. Although it differs depending on the pressure conditions, or the like, it is in general 100° C. or more.

After the formation of the core-shell fine particle shaving the core-shell structure by covering the core parts with the shell parts as mentioned above, in general, the core-shell fine particles are separated from the above-mentioned dispersing agent. As the separation method, for example, the sedimentation methods such as the centrifugal separation, the floatation and the foam separation, the filtration methods such as the cake filtration and the clarifying filtration, and the squeeze method can be presented. In the present invention, among the above-mentioned examples, the centrifugal separation can be used preferably.

In the case the sedimentation of the core-shell fine particles is difficult due to the extremely small size of the above-mentioned core-shell fine particles at the time of the above-mentioned separation, an additive may be used for improving the sedimentation property. Since the additive is same as those disclosed in the item of the above-mentioned core part preparing process, explanation is omitted here.

The present process is conducted in general under an inert gas atmosphere such as an argon gas and a nitrogen gas.

(3) Removing Process

Next, the removing process of the present invention will be explained. The removing process in the present invention is a process for removing the residual organic substance after the above-mentioned shell part preparing process.

Even after the separation from the above-mentioned dispersing agent, a dispersing agent, an organic solvent, an organic substance derived from an organic metal compound used for the core part precursor and the shell part precursor, an organic solvent, an additive, or the like may be adhered to the core-shell fine particles formed in the above-mentioned shell part preparing process. This process is carried out for removing the organic substances such as the residual organic substance, dispersing agent, or the like.

In this process, these organic substances may be removed by the thermal decomposition. The reaction conditions such as the heating temperature, the heating time and the pressure are not particularly limited as long as they are the conditions capable of decomposing and removing the above-mentioned organic substances. The reaction conditions can be determined using for example the differential thermal analysis (DTA), or the like. In general, it is carried out in an inert gas atmosphere such as a nitrogen and an argon, or in a reduced pressure atmosphere.

(4) Compression Molding Process

Next, the compressing molding process in the present invention will be explained. The compression molding process in the present invention is a process for compression molding the core-shell fine particles after removing the organic substances.

The above-mentioned method for compression molding the core-shell fine particles is not particularly limited as long as it is a method capable of coupling only the shell parts of the adjacent core-shell fine particles. For example, the hot press method, the spark plasma sintering method, or the like can be presented.

Moreover, the temperature at the time of compression molding the core-shell fine particles is not particularly limited as long as it is a temperature capable of coupling the shell parts of the adjacent core-shell fine particles without formation of the interface by melting the constituent materials of the shell parts. It differs depending on the pressure conditions and the shell part constituent materials. For example, it can be set at a temperature higher than the melting point of the shell part constituent materials and lower than the melting point of the core part fine particles. Moreover, as mentioned above, since the above-mentioned temperature differs depending on the pressure conditions, in the case the pressure is higher than a predetermined value, it can be set at a temperature lower than the melting point of the shell part constituent materials.

Furthermore, the pressure at the time of compression molding of the core-shell fine particles is not particularly limited as long as it is a pressure capable of coupling the shell parts of the adjacent core-shell fine particles without formation of the interface by melting the shell part constituent materials. As in the case of the above-mentioned temperature, it may be set with an optional adjustment.

The present invention is not limited to the embodiments mentioned above. The embodiments are merely examples, and any one having substantially same configuration as the technological idea disclosed in the scope of the claims of the present invention and the same effects is included in the technological scope of the present invention.

EXAMPLES

Hereinafter, the present invention will be explained specifically with reference to the examples.

Example 1

(Formation of the Core Part Fine Particles)

According to the method disclosed in J. Am. Chem. Soc., 123, 11651-11654 (2001), Zno fine particles having a 3 nm particle size were synthesized. They were not obtained as the ZnO fine particles alone but as a mixture with a trioctyl phosphine oxide (TOPO).

(Covering of the Core Parts with the Shell Parts)

The reaction field of the hot soap method was provided by the below dispersing agent and organic solvent.

| <Dispersing agent> | |
|---|---|
| 1,2-hexadecane diol (produced by ALDRICH) | 1.2 g |
| 1-adamantanecarboxylic acid (produced by ACROS) | 0.76 g |
| Hexadecyl amine (produced by KANTO KAGAKU.) | 12 g |
| <Organic solvent> | |
| Diphenyl ether (produced by KANTO KAGAKU.) | 6 ml |

The above-mentioned dispersing agent and organic solvent were mixed in a flask. 0.126 g of the above-mentioned mixture of the Zno fine particles and trioctyl phosphine oxide (TOPO) was added into the flask. After substituting the inside of the flask with an argon gas atmosphere, it was heated to 80° C.

Next, as a shell part precursor, a butoxy Sb (produced by AZmax.co) and a cobalt carbonyl (produced by KANTO KAGAKU.) was prepared and injected 0.26 g of a butoxySb to the above-mentioned flask. Subsequently, a solution with 0.043 g of a cobalt carbonyl mixed and dissolved in 0.4 ml of a dichlorobenzene (produced by KANTO KAGAKU.) was injected to the above-mentioned flask.

After the injection of the shell part precursors, the temperature was raised to 230° C. so as to be maintained at the temperature for 40 minutes. Thereafter, the reaction solution was cooled down by the air. At the time it was cooled down to. 60° C., 50 ml of an ethanol was added. The black precipitated substance was separated from the reaction solution by the centrifugal separation, and then washed with a solvent mixture of chloroform/ethanol=½ (volume ratio) so as to obtain black powders. According to the transmission electron microscope (TEM) observation of the obtained black powders, it was found out that they have a spherical shape with about a 20 nm particle size. Moreover, according to the EDX (element analysis) measurement, since Zn was present in the vicinity of the center of the fine particles, it was confirmed that core-shell fine particles having the core-shell structure with ZnO provided as the core parts and $CoSb_3$ provided as the shell parts were produced.

(Removal of the Organic Substances)

By maintaining the above-mentioned black powder in a reduced pressure atmosphere at 500° C. for 10 hours, the residual organic substances were removed.

(Compression Molding)

With the above-mentioned black powders after removal of the organic substances placed in dice of a predetermined shape, molding was carried out by the hot press method so as to obtain core-shell structures. The hot press conditions include a 500° C. temperature, and a 100 MPa pressure. The external appearance of the core-shell structures after molding was a silver solid.

Comparative Example (Formation of the Fine Particles)

Fine particles were produced in the same manner as in the example except that the ZnO fine particles and the trioctyl phosphine oxide (TOPO) were not added in the above-mentioned example so as to obtain fine particles of $CoSb_3$. The external appearance of the $CoSb_3$ fine particles was black powder. According to the transmission electron microscope (TEM) observation of the black powders, it was found out that they have a spherical shape with about a 20 nm particle size.

(Removal of the Organic Substances)

By maintaining the above-mentioned black powder in a reduced pressure atmosphere at 500° C. for 10 hours, the residual organic substances were removed.

(Compression Molding)

With the above-mentioned black powders after removal of the organic substances placed in dice of a predetermined shape, molding was carried out by the hot press method. The hot press conditions include a 500° C. temperature, and a 100 MPa pressure. The external appearance after molding was a silver solid.

[Evaluation]

Figure 4:
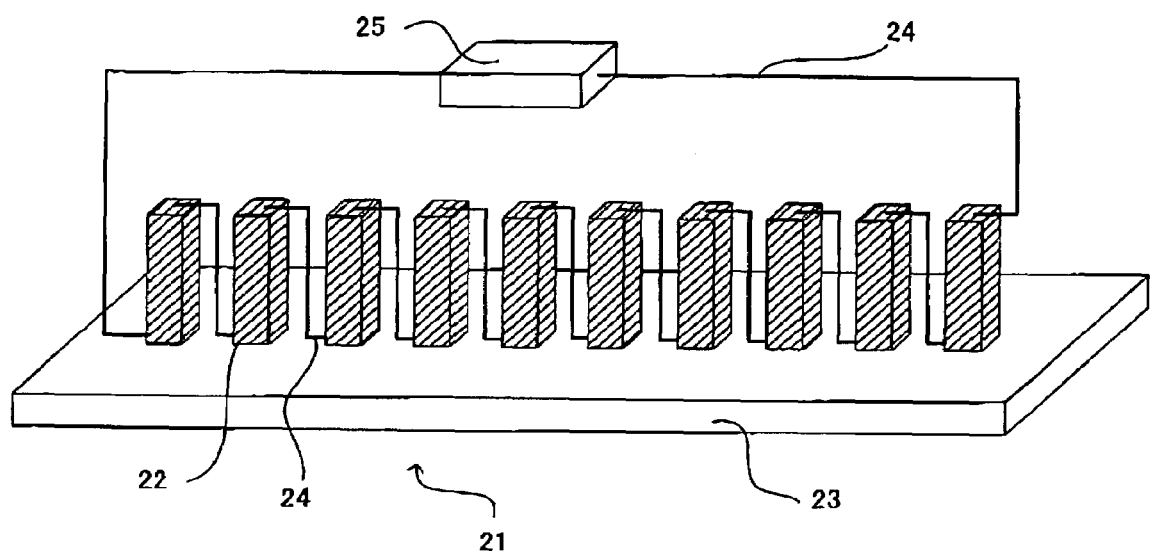
FIG. 4 is a schematic diagram showing an example of the thermoelectric conversion element using the thermoelectric conversion materials of the present invention.

(Comparison of the thermoelectric conversion performance) 100 each pieces of 0.5 mm×0.5 mm×3 mm rectangular parallelepipeds of the sliver solids obtained each in the example 1 and the comparative example were cut out. Next, with the cut out silver solids 22 disposed as shown in FIG. 4, the thermoelectric conversion element 21 were produced. Although the case with 10 pieces of the silver solids 22 is disclosed in FIG. 4, the 100 pieces of the silver solids 22 are disposed continuously by repeating the same arrangement as the 8 pieces in the central part. Here, the alumina substrate 23 has a 1 mm thickness, and the cut out silver solids 22 are linked in series by a copper line 24. Moreover, the numeral 25 is a light emitting diode, and a voltage raising circuit. At the time of producing the thermoelectric element, the silver solids and the copper line may be soldered as needed. Moreover, the alumina substrate and the silver solids may be brazed with a metal such as silver as needed. With a 500K heat supplied to the alumina substrate side in a room having a 300K room temperature, the light emitting diode emitted a light beam more brightly with the thermoelectric conversion element comprising the sliver solid of the example 1 than with the thermoelectric conversion element comprising the silver solid of the comparative example.

Example 2

The reaction field of the hot soap method was provided by the below dispersing agent and organic solvent.

| <Dispersing agent> | |
| --- | --- |
| 1,2-hexadecane diol (produced by ALDRICH) | 1.2 g |
| 1-adamantanecarboxylic acid (produced by ACROS) | 0.76 g |
| Hexadecyl amine (produced by KANTO KAGAKU.) | 12 g |
| <Organic solvent> | |
| Diphenyl ether (produced by KANTO KAGAKU.) | 6 ml |

The above-mentioned dispersing agent and organic solvent were mixed in a flask and heated to 220° C. after the substitution by an argon gas atmosphere. Next, a solution prepared by dissolving 0.025 g of a rhodium acetyl acetonate (produced by ALDRICH) as the core part precursor in 1.0 g of a dichlorobenzene (produced by KANTO KAGAKU) was injected into the above-mentioned flask at one time. After the injection, it was maintained at 220° C. for 20 minutes. Thereafter, the reaction liquid was cooled down with air to 80° C. Apart of the reaction liquid was collected, and the remainder was used for the shell formation.

After cooling down the reaction liquid after the partial collection with air to 60° C., an ethanol was added so as to obtain a black sediment. Then, after separation of the black sediment from the reaction liquid by the centrifugal separation, a chloroform was added so as to produce a dispersion liquid and it was precipitated again in an ethanol. By separating the sediment from the re-sedimentation liquid by the centrifugal separation, black powders were obtained. According to the TEM observation and the XRD measurement, it was confirmed that the powders were Rh fine particles having a 2 nm particle size.

As to the shell forming method, the part of injecting the shell part precursor and thereafter (covering of the core parts with the shell parts) was carried out in the same manner as in the example 1. As a result, black powders were obtained, and according to the TEM observation, it was confirmed to be spherical having about a 10 nm particle size. Moreover, according to the EDX measurement, since the Rh is present in the vicinity of the center of the fine particles, it was confirmed that core-shell fine particles having the core-shell structure with the Rh provided as the core parts and the $CoSb_3$ provided as the shell parts were produced.

The processes thereafter (removal of the organic substances) and (compression molding) were carried out in the same manner as in the example 1. The external appearance of the obtained core-shell structure was a silver solid.

[Evaluation]

(Comparison of the Thermoelectric Conversion Performance)

100 each pieces of 0.5 mm×0.5 mm×3 mm rectangular parallelepipeds of the silver solids obtained each in the example 2 and the comparative example were cut out. Next, with the cut out silver solids 22 disposed as shown in FIG. 4, the thermoelectric conversion element 21 were produced. Although the case with 10 pieces of the silver solids 22 is disclosed in FIG. 4, the 100 pieces of the silver solids 22 are disposed continuously by repeating the same arrangement as the 8 pieces in the central part. Here, the alumina substrate 23 has a 1 mm thickness, and the cut out silver solids 22 are linked in series by a copper line 24. Moreover, the numeral 25 is a light emitting diode, and 26 a pressure raising circuit.

At the time of producing the thermoelectric element, the silver solids and the copper line may be soldered as needed. Moreover, the almina substrate and the silver solids may be brazed with a metal such as a silver as needed. With a 500K heat supplied to the alumina substrate side in a room having a 300K room temperature, the light emitting diode emitted a light beam more brightly with the thermoelectric conversion element comprising the silver solid of the example 2 than with the thermoelectric conversion element comprising the silver solid of the comparative example.

What is claimed is:

1. A thermoelectric conversion material comprising a core-shell structure having:
    a plurality of core parts; and
    shell parts with a thermoelectric conversion material for covering the core parts,
    wherein the plurality of the core parts are dispersed independent from each other, the shell parts are provided continuously wherein the shell part of at least one core part is continuous with the shell part of a different core part, the core parts and the shell parts have different constituent elements, and the average particle size of the core parts is within a range of 0.3 nm to 100 nm.

2. The thermoelectric conversion material according to claim 1, wherein a constituent material of the core parts has a melting point higher than that of a constituent material of the shell parts.

3. The thermoelectric structure according to claim 1, wherein a thickness of a portion covering the core parts of the shell parts is within a range of 1 nm to 100 nm.

4. The thermoelectric structure according to claim 1, wherein a ratio of the particle size of the core parts and a thickness of the shell parts Is within a range of 1:10 to 10:1.

* * * * *

UNITED STATES PATENT AND TRADEMARK OFFICE
CERTIFICATE OF CORRECTION

PATENT NO. : 7,259,320 B2  Page 1 of 1
APPLICATION NO. : 11/086053
DATED : August 21, 2007
INVENTOR(S) : Seiji Take It is certified that error appears in the above-identified patent and that said Letters Patent is hereby corrected as shown below:

Title page, Item [73]    delete "Kyoungki-do (KR)" and insert
--Tokyo-to (JP)--

Signed and Sealed this

Seventeenth Day of August, 2010

David J. Kappos
*Director of the United States Patent and Trademark Office*